(12) United States Patent
Herring et al.

(10) Patent No.: US 7,403,393 B2
(45) Date of Patent: Jul. 22, 2008

(54) APPARATUS AND SYSTEM FOR COOLING HEAT PRODUCING COMPONENTS

(75) Inventors: Dean Frederick Herring, Youngsville, NC (US); Vinod Kamath, Raleigh, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/319,315

(22) Filed: Dec. 28, 2005

(65) Prior Publication Data

US 2007/0146996 A1 Jun. 28, 2007

(51) Int. Cl.
*H05K 7/20* (2006.01)
*F28F 7/00* (2006.01)

(52) U.S. Cl. .................. 361/700; 165/104.33; 257/719; 361/719

(58) Field of Classification Search .................. 361/700
See application file for complete search history.

(56) References Cited

U.S. PATENT DOCUMENTS

| | | | | |
|---|---|---|---|---|
| 3,999,403 | A | 12/1976 | Bower et al. | 62/514 |
| 4,012,770 | A | 3/1977 | Pravda et al. | 357/82 |
| 4,090,358 | A | 5/1978 | Young | 60/39.51 |
| 4,138,692 | A * | 2/1979 | Meeker et al. | 257/697 |
| 4,313,492 | A * | 2/1982 | Andros et al. | 165/104.26 |
| 4,787,843 | A | 11/1988 | Huffman | 432/91 |
| 4,879,632 | A * | 11/1989 | Yamamoto et al. | 361/720 |
| 4,951,740 | A | 8/1990 | Peterson et al. | 165/32 |
| 4,996,589 | A * | 2/1991 | Kajiwara et al. | 257/714 |
| 5,162,974 | A * | 11/1992 | Currie | 361/702 |
| 5,365,400 | A * | 11/1994 | Ashiwake et al. | 361/752 |
| 5,944,093 | A * | 8/1999 | Viswanath | 165/104.26 |
| 6,672,373 | B2 | 1/2004 | Smyrnov | 165/104.26 |
| 7,019,973 | B2 * | 3/2006 | Rivera | 361/700 |
| 2003/0037910 | A1 | 2/2003 | Smyrnov | 165/104.26 |

FOREIGN PATENT DOCUMENTS

EP  GB1421350  1/1976

* cited by examiner

*Primary Examiner*—Gregory D Thompson
(74) *Attorney, Agent, or Firm*—Kunzler & McKenzie

(57) ABSTRACT

An apparatus and system are disclosed for cooling of heat producing components. The apparatus may include a mounting plate rigidly connected with a top surface of a circuit board, the mounting plate positioned above a heat producing circuit board component, and a heat sink having first and second ends. The heat sink is configured to interface with the mounting plate in order to provide a downward force on the heat producing circuit board component. The apparatus also includes at least one bellows device coupling a heat transfer tip with the first end of the heat sink, wherein the bellows device is configured to transfer the downward force from the mounting plate to a top surface of the heat producing component and maintain the heat transfer tip in compliance with the plane of the top surface of the heat producing component. The system includes a circuit board, a plurality of heat producing circuit board components, and the described apparatus.

20 Claims, 5 Drawing Sheets

APPARATUS AND SYSTEM FOR COOLING HEAT PRODUCING COMPONENTS

BACKGROUND OF THE INVENTION

1. Field of the Invention

This invention relates to removing excess heat from a component and more particularly relates to removing excess heat from a circuit board component by conducting heat to an area with excess cooling capacity.

2. Description of the Related Art

In computers with limited space requirements, cooling of components is a critical part of the design. Component cooling is balanced with other design constraints such as space requirements and connectivity requirements. As a result, a heat sensitive component, such as a hard drive or processor, may be located such that cooling of the component is compromised. A heat sensitive component may be, but is not limited to, any component that would benefit by removing heat beyond the heat removed through typical convection or forced air cooling.

A heat sensitive component with inadequate cooling may run less efficiently. A heat sensitive component with inadequate cooling may also fail prematurely. Premature component failure and inefficient operation reduce the reliability and marketability of a computer and may result in reduced profits for the computer seller.

Typical methods of cooling using forced air or convection may not adequately cool heat sensitive components. Forced air cooling using directional channels or vanes may not be effective due to space constraints or cost. Adding more cooling through larger fans or additional fans may not be an effective solution due to long-term energy costs, reduced reliability, noise considerations, or the like.

Adding a heat sink to a heat sensitive component may not be possible due to space constraints. Adding a heat sink to a heat sensitive component also may not be effective if the heat sensitive component is located where cooling capacity is not adequate to make the addition of a heat sink effective.

The above mentioned problems associated with cooling a heat sensitive component are compounded in computers or other electronic equipment with extreme space constraints such as rack-mounted blade servers, lap-top computers, and the like. In addition, low energy use constraints in computers such as lap-top computers makes solving cooling problems for heat sensitive components through increased fan size or additional fans an unattractive solution.

Another solution to the problem of cooling heat producing components is the use of a heat pipe. Heat pipes are simple mechanical devices that transfer heat from one point to another. Typically heat pipes include a sealed heat chamber that contains a vaporizable fluid. As a heat producing component heats the heat pipe, the fluid vaporizes, releasing heat from the surface of the fluid. The vaporized fluid moves to a separate area where the heat is transferred to a cooling device such as a heat sink. The vapor cools, condenses, and gravity pulls the condensed vapor back to the heat source.

Heat pipes have proven to be a very effective method of cooling heat producing components on a circuit board. Heat pipes are especially effective with central processing units (CPUs) and graphics processing units (GPUs). A factor in the efficiency of the heat pipe is the ability to provide a sufficient downward force on a heat transfer tip that engages the heat producing component. In order to transfer heat effectively, the heat transfer tip must maintain contact with the heat producing component. The downward force ensures sufficient contact.

Generally, the downward force is provided by a plurality of fastening mechanisms, such as screws, that couple the heat pipe to the circuit board. One problem that arises, however, is introduced by the fastening mechanisms and causes the heat transfer tip to not fully engage the heat producing component. Often times, one fastening mechanisms is attached with more torque than another causing the heat transfer tip to not maintain a parallel relationship with the heat producing component, but rather have a gap. Because air is a horrible conductor of heat, this gap greatly reduces the efficiency of the heat pipe.

From the foregoing discussion, it should be apparent that a need exists for an apparatus and system to conduct heat from a heat producing component to an area in a computer with excess cooling capacity. Beneficially, such an apparatus and system would maintain sufficient contact of the heat transfer tip and the heat producing component.

SUMMARY OF THE INVENTION

The present invention has been developed in response to the present state of the art, and in particular, in response to the problems and needs in the art that have not yet been fully solved by currently available cooling systems. Accordingly, the present invention has been developed to provide an apparatus and system for cooling of heat producing electrical components that overcome many or all of the above-discussed shortcomings in the art.

The apparatus to cool heat producing electrical components is provided with a mounting plate rigidly connected with a top surface of a circuit board, the mounting plate positioned above a heat producing circuit board component, and a heat sink having first and second ends, the heat sink configured to interface with the mounting plate in order to provide a downward force on the heat producing circuit board component.

In one embodiment, the apparatus also includes at least one bellows device coupling a heat transfer tip with the first end of the heat sink, the bellows device configured to transfer the downward force from the mounting plate to a top surface of the heat producing component and maintain the heat transfer tip in compliance with the plane of the top surface of the heat producing component.

The apparatus may also include a heat pipe configured with a heat chamber, the heat chamber having a vaporizable liquid and configured to transfer heat away from the heat producing circuit board component. In a further embodiment, the apparatus includes a cylinder configured to slidably engage an interior surface of the heat pipe and maintain a constant heat chamber volume, and a second bellows device coupled with the second end of the heat sink and configured to extend and retract in order to allow the heat chamber to maintain constant heat chamber volume.

In one embodiment, the apparatus includes a plurality of heat fins extending outwardly from the heat sink and configured to increase the surface area of the heat sink in order to dissipate heat from the heat sink. In a further embodiment, the apparatus also includes a wick structure coupled to an interior surface of the heat sink and configured to transport a fluid. The bellows and the heat transfer tip may be formed substantially of a heat conductive metal, such as, but not limited to, aluminum, copper, aluminum-copper alloy, silver, gold, tungsten, and beryllium. Furthermore, the apparatus may include a plurality of bellows devices, each bellows device coupling a heat transfer tip to the heat sink, the heat sink configured to cool a plurality of heat producing circuit board components.

A system of the present invention is also presented to cool heat producing electrical components. In particular, the system, in one embodiment, includes a circuit board, a plurality of heat producing circuit board components, and the apparatus.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1A:
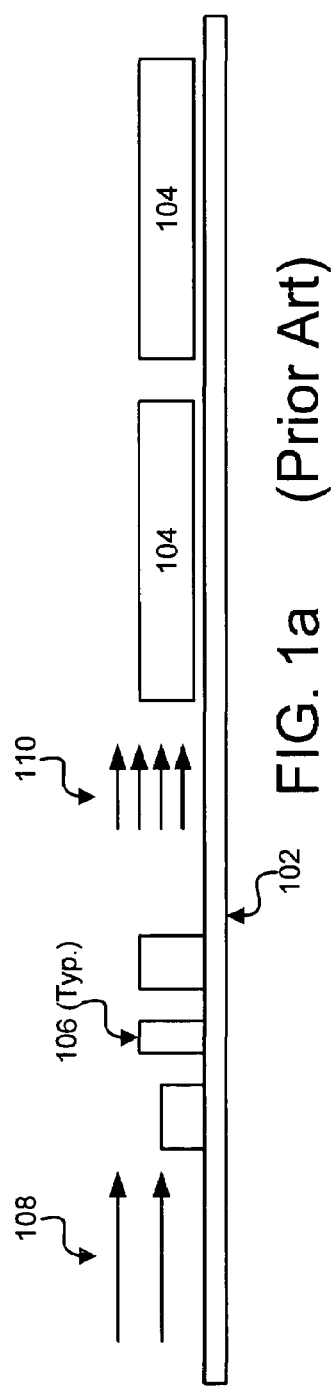
FIG. 1a is a side view of a schematic block diagram illustrating a typical circuit board with components in accordance with the prior art.
Figure 1B:
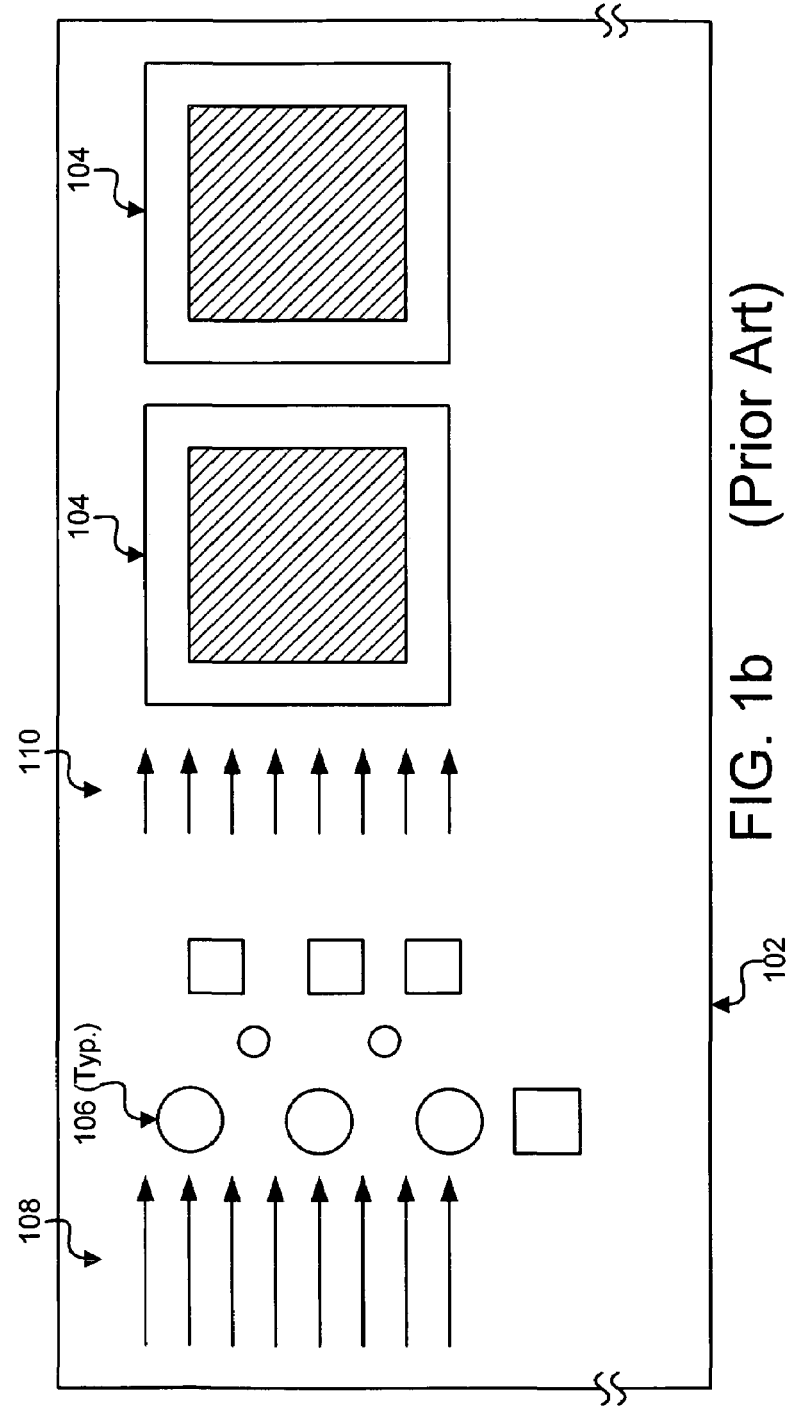
FIG. 1b is a top view of the schematic block diagram illustrating the circuit board with components in accordance with the prior art.

FIG. 1a is a side view of a typical circuit board 102 with components. FIG. 1b is a top view of the circuit board 102 with components. The circuit board 102 that may be part of a server, a laptop computer, a workstation, or other electronic device. The circuit board 102 includes one or more heat producing components 104. In one embodiment, the heat producing component 104 is a hard drive. In another embodiment, the heat producing component 104 is a processor. In yet another embodiment, the heat producing component 104 is a random access memory ("RAM") chip. One skilled in the art will recognize other heat producing components where removal of excess heat is beneficial.

The circuit board 102 includes other components 106. The components 106 may be resistors, capacitors, integrated circuits, processors, memory, or the like. The components 106 are situated on the circuit board 102 to have cooling by means of air flow 108 or air circulation. The air flow 108 may be caused by forced air cooling using a fan, convection cooling, or other typical computer cooling method. The components 106 are situated with respect to the heat producing components 104 so that the heat producing components 104 have less air flow 110 or cooling capacity than the air flow 108 or cooling for the components 106.

In one embodiment, the circuit board 102 is part of a blade server with limited space requirements. In such a blade server, cooling of a heat producing component 104 may be more difficult than for other components 106 due to space constraints and layout requirements. Increased cooling to the heat producing components 104 is desirable for increased performance, increased life, or increased reliability of the heat sensitive component 104. Increased cooling by means of increased air flow 110 to the heat producing component 104 may be difficult due to space constraints, energy constraints, or noise constraints. For example, increasing the size of a fan used for cooling may increase energy costs beyond desired or required limits or may increase noise levels beyond acceptable bounds. In another example, space constraints may hinder the use of vanes or ducts to direct more air flow 108 to the heat producing component 104. In other embodiments, the circuit board 102 is part of a laptop, a server, a workstation, a desktop computer, digital video disc ("DVD") player, or other electronic device.

Figure 2A:
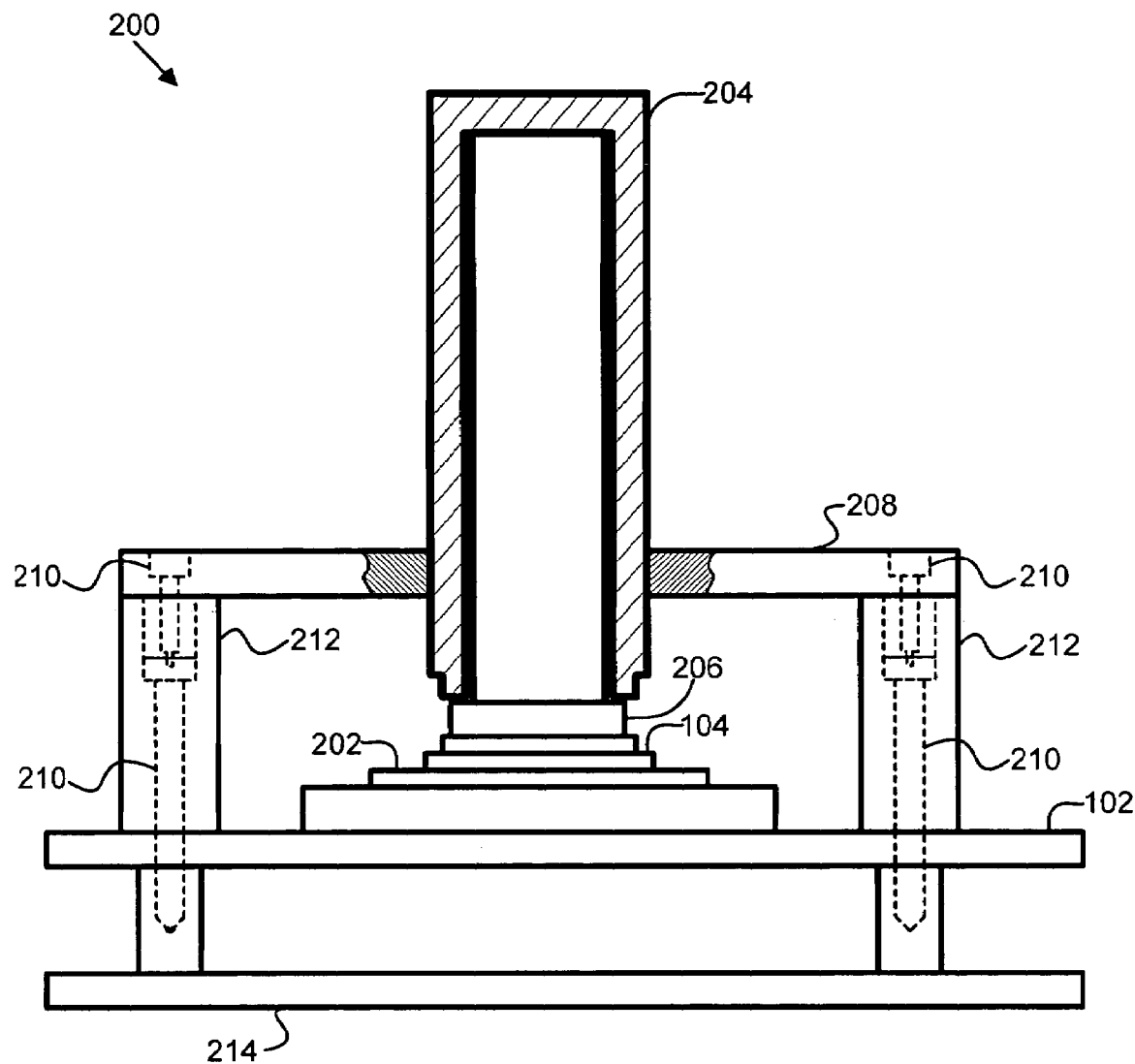
FIG. 2a is a cross-sectional view of a system for cooling heat producing components in accordance with the prior art.

FIG. 2a is a cross-sectional view of a system 200 for cooling heat producing components 104 in accordance with the prior art. In one embodiment, the system 200 comprises the circuit board 102 and at least one heat producing circuit board component (hereinafter "component") 104. The component 104, in the depicted embodiment, comprises a central processing unit (CPU) seated in a socket 202. Currently, processors are configured having a variety of different socket configurations. Socket configurations generally are determined by CPU design. However, a cooling device is commonly coupled to the CPU regardless of the socket 202 configuration.

Examples of cooling devices suitable for use in cooling the component 104 include heat sinks, heat sinks with fans, heat pipes, water cooling systems, Freon cooled systems, and the like. In the depicted embodiment, the system 200 is cooled by a heat pipe 204. Heat pipes 204 generally comprise a heat transfer tip 206 coupled to a first end of the heat pipe 204. The heat transfer tip 206 is configured to transfer heat away from the component 104.

A mounting plate 208 maintains the position of the heat pipe 204 in relation to the component 104. The heat pipe 204 may be fixedly coupled with the mounting plate 208, or alternatively, the heat pipe 204 may be removably coupled to the mounting plate 208. Fastening devices 210 attach the mounting plate 208 to a plurality of standoffs 212, which in turn are connected with the circuit board 102 or motherboard. Likewise, the circuit board 102 may be connected with a case 214

A downward force is applied to a top surface of the component by the mounting plate 208 being fastened to the circuit board 102. Unfortunately, the fastening devices 210 may be fastened or secured with varying amounts of torque, subsequently causing an uneven force being applied to the component 104.

Figure 2B:
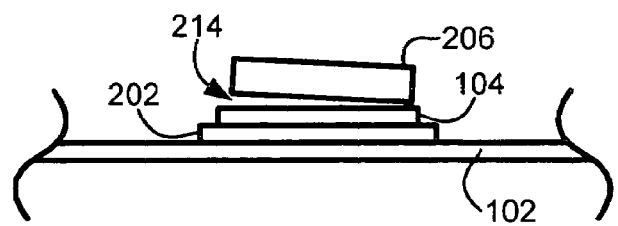
FIG. 2b is a side view diagram illustrating one embodiment of an uneven downward force being applied to a component in accordance with the prior art.

FIG. 2b is a side view showing one example of an uneven downward force being applied to the component 104 in accordance with the prior art. As depicted, the heat transfer tip 206 may not fully engage the top surface of the component 104 due to the previously discussed uneven force applied by the mounting plate 208. A gap 214 between the component 104 and the heat transfer tip 206 may occur and thereby greatly reduce the efficiency of the heat pipe 204. Air is a horrible conductor of heat, and therefore gaps 214 between the component 104 and the heat transfer tip 206 are undesirable.

Figure 3:
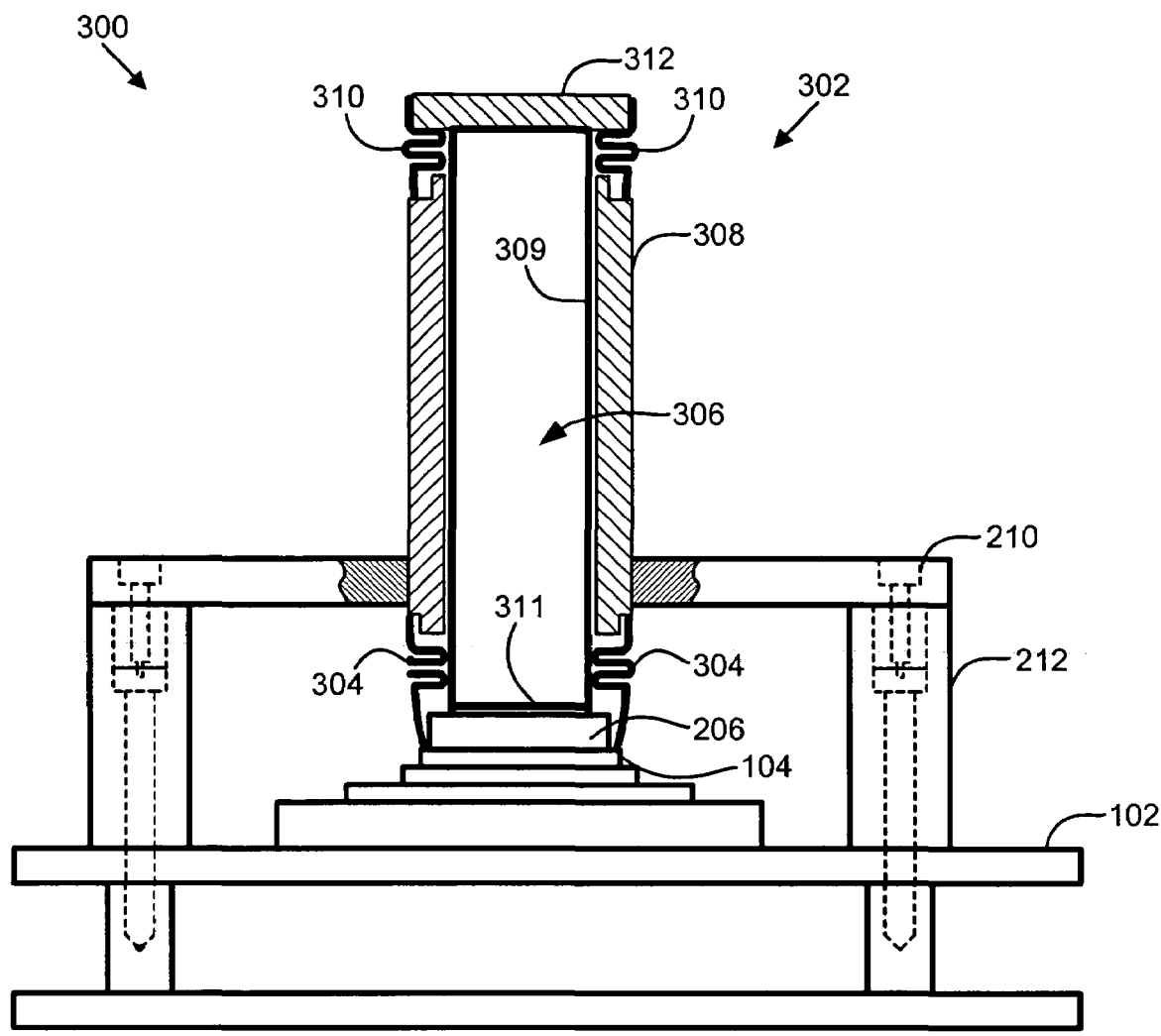
FIG. 3 is a cross-sectional view of a system for cooling a component in accordance with the present invention.

FIG. 3 is a schematic block diagram illustrating a cross-sectional view of a system 300 for cooling the component 104 in accordance with the present invention. The system 300, in one embodiment, is configured to provide a downward force on the heat transfer tip 206 in order to ensure a fully compliant heat transfer tip 206 to component 104 interface. As used herein, the term "downward force" refers to a force directed towards the circuit board 102.

In one embodiment, the term "compliant" refers to a first planar surface being substantially coplanar with a second planar surface. For instance, the bottom or component facing surface of the heat transfer tip 206 is compliant with a top surface of the component 104 when both surfaces are coplanar. One benefit of compliance between the heat transfer tip 206 and the component 104 is the impossibility of a gap between the heat transfer tip 206 and the component 104 when a downward force is applied to the heat transfer tip 206.

In a further embodiment, the system 300 comprises a heat pipe 302 configured to supply a downward force. The heat pipe 302 may include a flexible bellows device 304 configured to transfer the downward force from the heat pipe 302 and the mounting plate 210 to the heat transfer tip 206. The bellows device (hereinafter "bellows") 304 is configured to articulate in order to enable the heat transfer tip 206 to maintain a compliant interface with the component 104. As used herein, the term "bellows" refers to a flexible, accordion-like device that allows movement in both horizontal and vertical directions. The bellows 304 may act in a manner similar to a spring, and therefore may be configured with a predetermined "spring rate" that supplies a selected downward force on the component 104.

As described above with reference to FIG. 2b, unequal torque applied to the fastening devices 210 may result in the heat pipe 302 not having a perpendicular configuration in relation to the component 104. The bellows 304 allow the heat pipe 302 to not be perpendicular with the component 104 while the heat transfer tip 206 is compliant or coplanar with the component 104. In one embodiment, the bellows is formed of a thin flexible metal selected to provide a sufficient force on the component 104. In one embodiment, a sufficient force is approximately 20 PSI.

In a further embodiment, the heat pipe 302 comprises a heat chamber 306 located within a container 308. The heat chamber 306 is a unitary and sealed unit formed from by the outer container 308. The heat chamber 306 may also be formed by a slidable wick 309 which may contain a vaporizable fluid. The heat chamber 306, in one embodiment, is configured with a constant volume.

In order to maintain a constant volume, the wick 309 is slidably coupled with the container 308. The wick 209, in one embodiment, comprises a capillary wicking material configured to transport the fluid. The wick may be formed of a sintered porous material like steel, aluminum, nickel, copper, and ceramics. Furthermore, the wick may be formed of a sintered powder, a grooved tube, a screen mesh, or cloth. The wick is configured to generate a capillary pressure to transport the fluid from an area where the fluid condenses back to an area where the fluid evaporates. The wick 309 contacts the heat transfer tip 206 at a bottom surface 311.

The bottom surface 311 may be soldered to the heat transfer tip 206 in order to maximize heat flow away from the heat transfer tip 206. The depicted embodiment illustrates a small gap between the heat transfer tip 206 and the bottom surface 311 for illustration purposes only. As described above, the heat transfer tip 206 and the bottom surface 311 may be mechanically fastened together, thereby leaving no gap.

In order to allow the heat chamber 306 to maintain a constant volume as the bellows 304 compress, a second bellows 310 may be coupled to a second end of the container 308. The bellows 304, 310 expand and contract in response to the downward force applied by the mounting plate 208. The bellows 304, 310 may be welded or soldered to the container 308. In one instance, as fastening devices 210 are torqued down the heat pipe 302 compresses the first bellows 304 and applies the downward force on the component 104. Meanwhile, the heat chamber 306 subsequently pushes upward on a cap piece 312 and extends the second bellow 310.

As is well known in the art, the volume of the heat chamber 306 is critical in determining the amount of vaporizable fluid used in the heat chamber 306. A careful balance of the operating temperatures of the component 104 together with the volume must be calculated to ensure heat pipe efficiency. The system 300 beneficially enables the heat chamber 306 to maintain a constant volume while the mounting plate 208 and the heat pipe 302 compress the bellows 304 in order to provide the necessary downward force.

Figure 4:
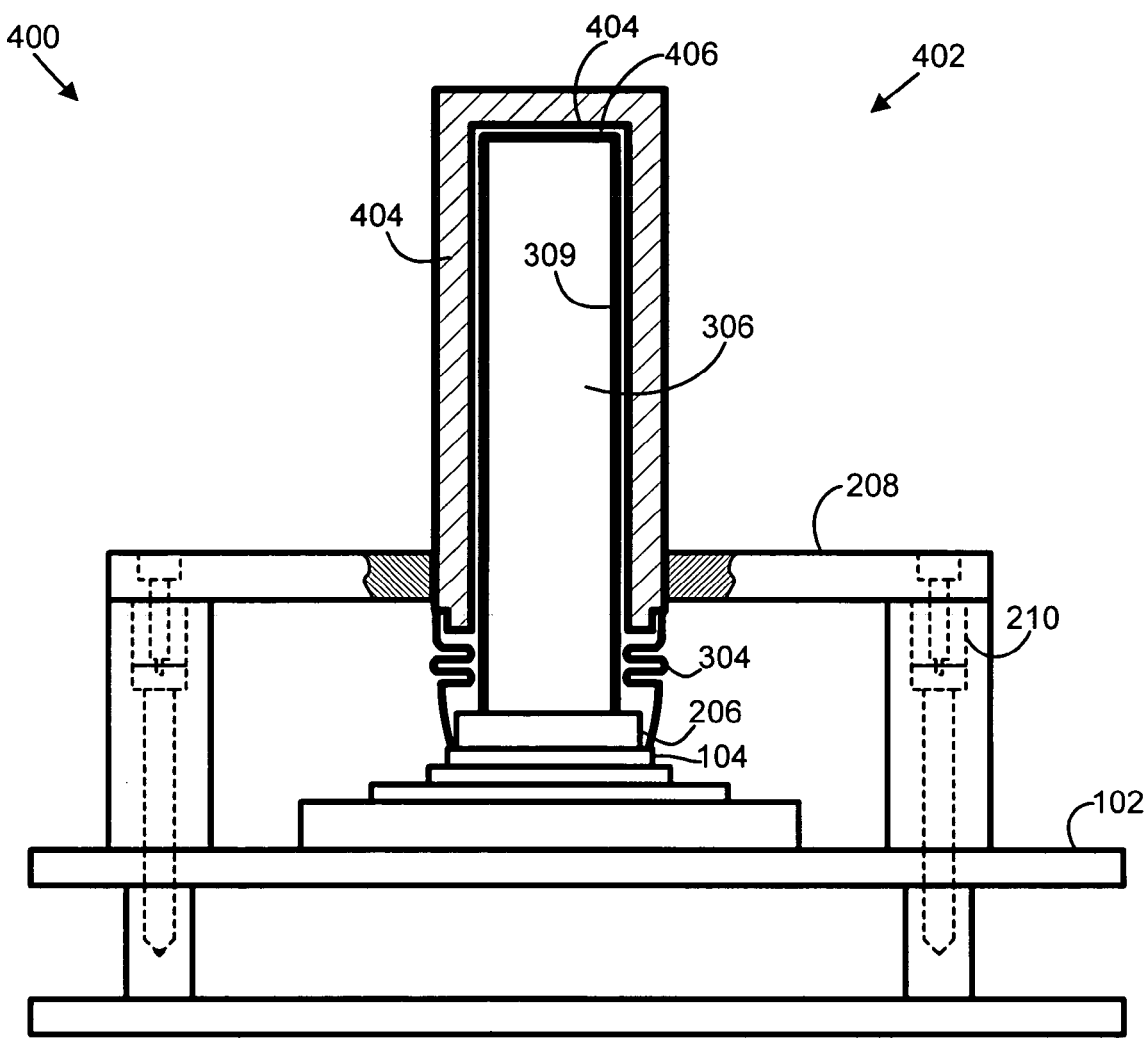
FIG. 4 is a cross-sectional view of an alternative embodiment of a system for cooling a component in accordance with the present invention.

FIG. 4 is a side view of an alternative embodiment of a system 400 for cooling the component 104 in accordance with the present invention. In one embodiment, the system 400 comprises a heat pipe 402 having a single bellows 304 configuration. The heat pipe 402 may be configured with a unitary container 404 having no upper bellows as depicted above with reference to FIG. 3. The heat pipe 402 may comprise a constant volume heat chamber 306 mechanically coupled with the heat transfer tip 206 and configured to slidably engage the interior surface of the container 404.

In one embodiment, the heat chamber 306 is selected with a volume slightly less than the volume of the container 404 such that when the mounting plate 208 is secured to the circuit board 102 and the container 404 subsequently compresses the bellows 304, the top 406 of the wick just comes in contact with the top interior surface of the container 404. Alternatively, the wick 309 may be formed of a compressible material in order to conform to the shrinking volume of the container 404 as the mounting plate 208 is secured to the circuit board 102.

Figure 5:
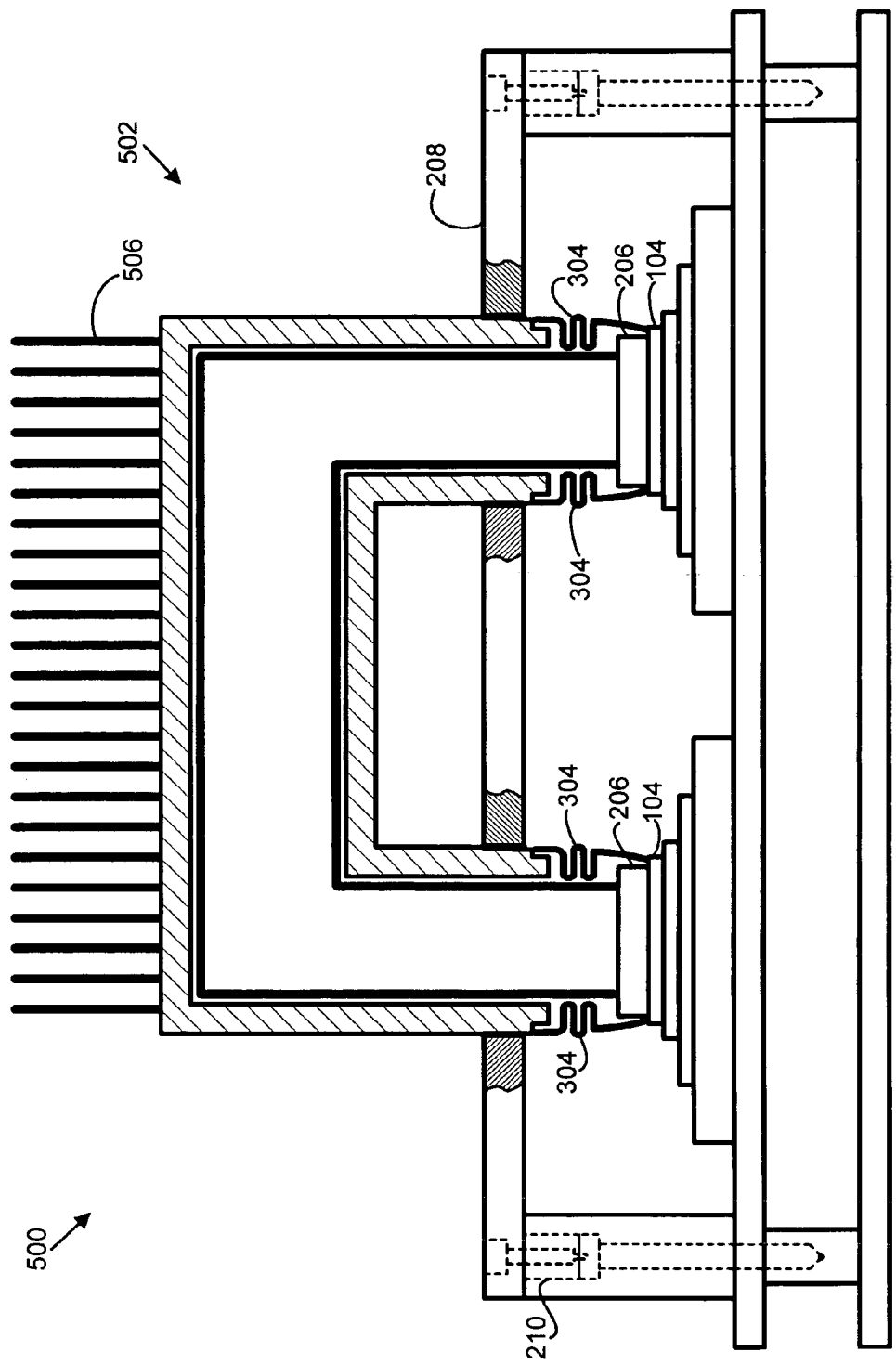
FIG. 5 is a cross-sectional view of a system for cooling multiple components in accordance with the present invention.

FIG. 5 is a cross-sectional view of a system 500 for cooling multiple components 104 in accordance with the present invention. In one embodiment, the system 500 is configured to cool multiple components 104 such as multiple processors in a dual processor computing system. Alternatively, the multiple components 104 may comprise different components such as a processor and a north bridge of a chipset, for example. Furthermore, the components 104 may be configured with varying heights. As depicted, the system 500 illustrates multiple identical components, however a processor and a graphics processing unit, for example, could possibly have different heights with respect to the circuit board 102.

The bellows 304 of a multi-component heat pipe 502 are configured to engage components 104 of varying heights by compressing in a manner similar to an accordion or a spring. The heat pipe 502 may also be configured with a constant volume heat chamber 504, wherein the volume is selected to maintain a steady state condensation/evaporation reaction of the vaporizable liquid. Alternatively, the heat chamber 504 may have a variable volume.

In one embodiment, the heat pipe 502 comprises a plurality of cooling fins 506. The cooling fins 506 may be formed of a heat conducting metal such as aluminum or copper. The cooling fins 506 are coupled with the heat pipe 502. Examples of methods for coupling the cooling fins 506 include welding, soldering, and forming the heat pipe 502 with integral cooling fins 506. Cooling fins 506 are configured to increase the surface area of the heat pipe 502 in order to increase the area through which heat may dissipate into the atmosphere. Cooling fins 506 may also be coupled with heat pipes 302, and 402 of FIGS. 3 and 4, respectively. Cooling fins 506 are well known to those skilled in the art of cooling heat producing components and therefore will not be given further discussion herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to cool a heat producing component, the apparatus comprising:
   a mounting plate rigidly connected with a top surface of a circuit board, the mounting plate positioned above a heat producing component mounted on the circuit board;
   a heat sink having first and second ends, the heat sink configured to interface with the mounting plate in order to provide a downward force on the heat producing component; and
   a bellows device coupling a heat transfer tip with the first end of the heat sink, the bellows device configured to transfer the downward force from the mounting plate to a top surface of the heat producing component and maintain the heat transfer tip in compliance with the plane of the top surface of the heat producing component.

2. The apparatus of claim 1, wherein the heat sink comprises a heat pipe configured with a heat chamber, the heat chamber having a vaporizable liquid and configured to transfer heat away from the heat producing component.

3. The apparatus of claim 2, wherein the heat chamber further comprises a cylinder configured to slidably engage an interior surface of the heat pipe and maintain a constant heat chamber volume.

4. The apparatus of claim 2, further comprising a second bellows device coupled with the second end of the heat sink and configured to extend and retract in order to allow the heat chamber to maintain constant heat chamber volume.

5. The apparatus of claim 1, further comprising a plurality of heat fins extending outwardly from the heat sink and configured to increase the surface area of the heat sink in order to dissipate heat from the heat sink.

6. The apparatus of claim 1, further comprising a wick structure coupled to an interior surface of the heat sink and configured to transport a fluid.

7. The apparatus of claim 1, wherein the bellows device and the heat transfer tip are formed substantially of a heat conductive metal.

8. The apparatus of claim 7, wherein the heat conductive metal is selected from the group consisting of aluminum, copper, aluminum-copper alloy, silver, gold, tungsten, and beryllium.

9. The apparatus of claim 1, wherein a plurality of heat producing components are mounted on the circuit board and further comprising a plurality of bellows devices and heat transfer tips, each bellows device coupling a heat transfer tip to the heat sink and each bellows device configured to transfer the downward force from the mounting plate to a top surface of a corresponding heat producing component and maintain the heat transfer tip in compliance with the plane of the top surface of the corresponding heat producing component, the heat sink configured to cool the heat producing components coupled to the heat sink through the heat transfer tips.

10. A system to cool a heat producing component, the system comprising:
    a circuit board;
    a plurality of heat producing components mounted on the circuit board;
    a mounting plate rigidly connected with a top surface of the circuit board, the mounting plate positioned above at least one of the heat producing components;
    a heat sink having first and second ends, the heat sink configured to interface with the mounting plate in order to provide a downward force on a heat producing component; and
    a bellows device coupling a heat transfer tip with the first end of the heat sink, the bellows device configured to transfer the downward force from the mounting plate to a top surface of the heat producing component and to maintain the heat transfer tip in compliance with the plane of the top surface of the heat producing component.

11. The system of claim 10, wherein the heat sink comprises a heat pipe configured with a heat chamber, the heat chamber having a vaporizable liquid and configured to transfer heat away from the heat producing component.

12. The system of claim 11, wherein the heat chamber further comprises a cylinder configured to slidably engage an interior surface of the heat pipe and maintain a constant heat chamber volume.

13. The system of claim 11, further comprising a second bellows device coupled with the second end of the heat sink and configured to extend and retract in order to allow the heat chamber to maintain constant heat chamber volume.

14. The system of claim 10, further comprising a plurality of heat fins extending outwardly from the heat sink and configured to increase the surface area of the heat sink in order to dissipate heat from the heat sink.

15. The system of claim 10, further comprising a wick structure coupled to an interior surface of the heat sink and configured to transport a fluid.

16. The system of claim 10, wherein the bellows device and the heat transfer tip are formed substantially of a heat conductive metal.

17. The system of claim 16, wherein the heat conductive metal is selected from the group consisting of aluminum, copper, aluminum-copper alloy, silver, gold, tungsten, and beryllium.

18. The system of claim 10, further comprising a plurality of bellows devices and heat transfer tips, each bellows device coupling a heat transfer tip to the heat sink and each bellows device configured to transfer the downward force from the mounting plate to a top surface of a corresponding heat producing component and maintain the heat transfer tip in compliance with the plane of the top surface of the corresponding heat producing component, the heat sink configured to cool the heat producing components coupled to the heat sink through the heat transfer tips.

19. An apparatus to cool a heat producing component, the apparatus comprising:
   a mounting plate rigidly connected with a top surface of a circuit board, the mounting plate positioned above a heat producing component mounted on the circuit board;
   a heat sink having first and second ends, the heat sink configured to interface with the mounting plate in order to provide a downward force on the heat producing component;
   a first bellows device coupling a heat transfer tip with the first end of the heat sink, the bellows device configured to transfer the downward force from the mounting plate to a top surface of the heat producing component and maintain the heat transfer tip in compliance with the plane of the top surface of the heat producing component; and
   a second bellows device coupled with the second end of the heat sink and configured to extend and retract in order to allow a heat chamber to maintain constant heat chamber volume.

20. An apparatus to cool heat producing components, the apparatus comprising:
   a mounting plate rigidly connected with a top surface of a circuit board, the mounting plate positioned above a plurality of heat producing components mounted to the circuit board;
   a heat sink having first and second ends, the heat sink configured to interface with the mounting plate in order to provide a downward force on each of the heat producing components, the heat sink configured to cool the plurality of heat producing components; and
   a plurality of bellows devices, each bellows device coupling a heat transfer tip with the heat sink, each bellows device configured to transfer the downward force from the mounting plate to a top surface of a corresponding heat producing component and maintain the heat transfer tip in compliance with the plane of the top surface of the corresponding heat producing component.

* * * * *